US008841971B1

(12) United States Patent
Geis et al.

(10) Patent No.: US 8,841,971 B1
(45) Date of Patent: Sep. 23, 2014

(54) SHORT CIRCUIT CURRENT PROTECTION IN AN AMPLIFIER

(71) Applicant: Google Inc., Mountain View, CA (US)

(72) Inventors: Arnd Geis, San Carlos, CA (US); Benjamin Joseph Mossawir, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/717,166

(22) Filed: Dec. 17, 2012

(51) Int. Cl.
H02H 7/20 (2006.01)
(52) U.S. Cl.
USPC ............................ 330/298; 330/207 P
(58) Field of Classification Search
CPC ....................................... H02H 7/20
USPC ................. 330/298, 207 P, 260, 261, 257
See application file for complete search history.

(56) References Cited

U.S. PATENT DOCUMENTS 6,492,845 B1 * 12/2002 Ge et al. ............................ 327/53
7,265,601 B2 * 9/2007 Ahmad ........................ 327/403
7,622,902 B1   11/2009 Kao et al.
8,054,085 B2   11/2011 Johansen et al.
8,106,639 B1   1/2012  Ju et al.
8,432,222 B2 * 4/2013  Ivanov ........................... 330/258
2002/0153956 A1* 10/2002 Wojslaw ....................... 330/296
2008/0265822 A1* 10/2008 Menegoli et al. ............. 318/569
2011/0115399 A1  5/2011  Sadwick et al.

* cited by examiner

Primary Examiner — Henry Choe
(74) Attorney, Agent, or Firm — Morris & Kamlay LLP

(57) ABSTRACT

Systems and method that provide short circuit protection for a power amplifier are described. The system can include, for example, a sense network that receives an output current from the power amplifier that is to be protected. The sense network can include, for example, a first resistor and a second resistor in series. The sense amplifier has a first input and a second input in which the first input is coupled to a first end of the first resistor and in which second input is coupled to a second end of the first resistor. The sense amplifier amplifies a voltage across the first resistor of the sense network in which the voltage is based on the output current from the power amplifier. Based on the amplified voltage of the sense amplifier, the feedback network reduces the output current from the power amplifier to protect the power amplifier from damage due to a short circuit condition.

60 Claims, 3 Drawing Sheets

SHORT CIRCUIT CURRENT PROTECTION IN AN AMPLIFIER

CROSS-REFERENCE TO RELATED APPLICATION/INCORPORATION BY REFERENCE

The present application is related to U.S. application Ser. No. 13/717,112, concurrently filed herewith and entitled "Short Circuit Current Protection in an Amplifier." The above-identified application is hereby incorporated by reference herein in its entirety.

BACKGROUND

Conventional circuitry such as an amplifier can fall prey to current damage when the output of the amplifier is placed in a short circuit or other high current condition.

Further limitations and disadvantages of conventional and traditional approaches will become apparent to one of skill in the art through the comparison of such systems with some aspects of some embodiments according to the present disclosure as set forth in the remainder of the present application with reference to the drawings.

BRIEF SUMMARY

Aspects of the disclosure relate to short circuit protection for circuitry. In an example embodiment, the short circuit protection is used to protect an amplifier such as, for example, a power amplifier.

An example embodiment provides one or more circuits that provide short circuit protection. The one or more circuits can include, for example, a sense network, a sense amplifier and a feedback network. The sense network receives an output current from the power amplifier that is to be protected and includes a first resistor and a second resistor. The first resistor and the second resistor are in series. The sense amplifier has a first input and a second input. The first input is operatively coupled to a first end of the first resistor. The second input is operatively coupled to a second end of the first resistor. The sense amplifier amplifies a voltage across the first resistor of the sense network in which the voltage being amplified by the sense amplifier is based on the output current from the power amplifier. Based on the amplified voltage of the sense amplifier, the feedback network reduces the output current from the power amplifier to protect the power amplifier from damage due to a short circuit condition.

An example embodiment provides a method for providing short circuit protection to a power amplifier. The method can include, for example, one or more of the following: receiving a first voltage across a resistor of a plurality of resistors in electrical series, wherein the resistor is in an output path that includes an output transistor of an output stage of the power amplifier and an output of the power amplifier; switching a current from a first branch of a differential amplifier to a second branch of the differential amplifier when the received voltage exceeds a voltage offset of the differential amplifier, wherein the second branch of the differential amplifier includes a first transistor; turning on a feedback transistor via an output of the first transistor after the switching of the current; and decreasing a second voltage at an input of the output transistor to decrease an amount of current passing through the output transistor and the output of the power amplifier.

An example embodiment provides a system for providing short circuit protection to a power amplifier. The system can include, for example, a plurality of resistors, a differential amplifier and a feedback transistor. The plurality of resistors, which are configured in electrical series, are disposed between an output transistor of an output stage of the power amplifier and an output of the power amplifier. The differential amplifier is operatively coupled to a first terminal of a resistor of the plurality of resistors and to a second terminal of the resistor. The differential amplifier receives a first input signal from the first terminal and a second input signal from the second terminal as differential inputs. The differential amplifier is configured with a voltage offset and a current from a first transistor of a differential amplifier to a second transistor of the differential amplifier when the differential inputs to the differential amplifier provide a differential voltage that exceeds the voltage offset of the differential amplifier. The feedback transistor is operatively coupled to the second transistor. The feedback transistor is turned on by the second transistor when the differential voltage exceeds the voltage offset of the differential amplifier. The turning on of the feedback transistor causes the output transistor of the output stage to reduce current passing through the output of the power amplifier.

These and other advantages, aspects and novel features of the present disclosure, as well as details of an illustrated embodiment thereof, will be more fully understood from the following description and drawings.

DETAILED DESCRIPTION

Aspects of the disclosure relate to short circuit protection for circuitry. In an example embodiment, the short circuit protection is used to protect a circuit such as an amplifier or a circuit including an amplifier, for example.

Figure 1:
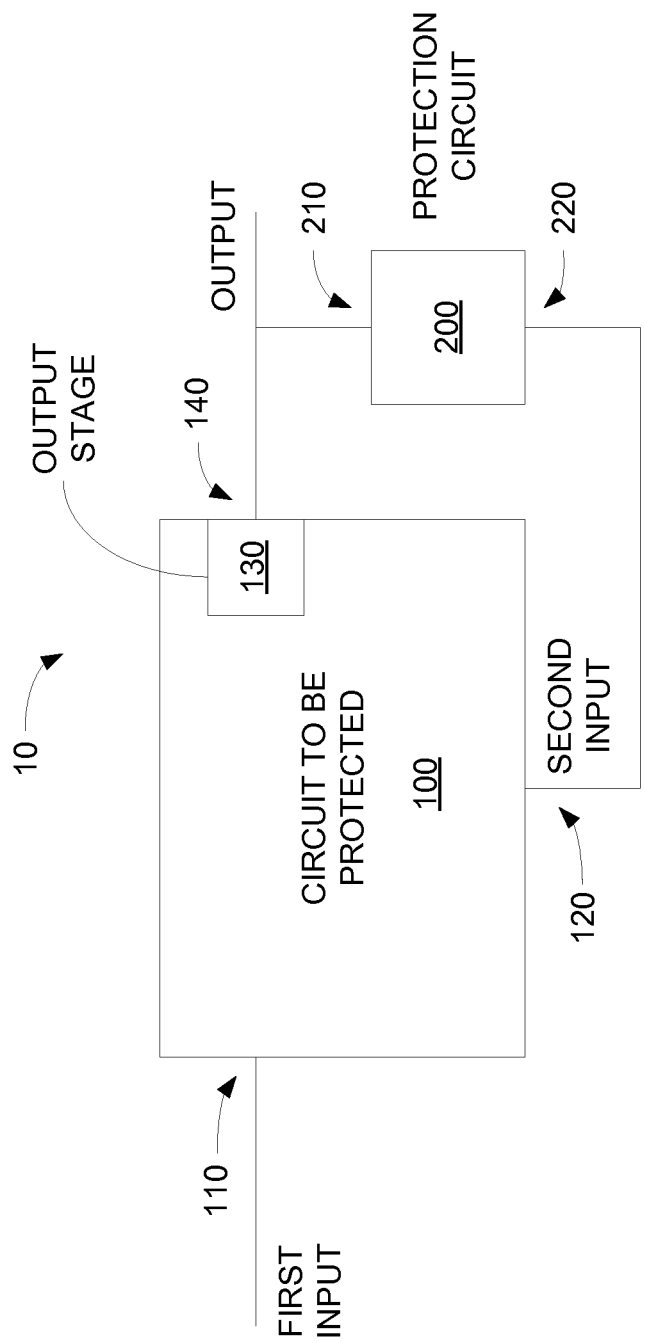
FIG. 1 is a block diagram of an example embodiment of a system for protecting a circuit during a short-circuit condition.

FIG. 1 illustrates a system 10 for protecting a circuit 100 in accordance with an example embodiment of the disclosure. Referring to FIG. 1, the circuit 100 has one or more first inputs 110, one or more second inputs 120, an output stage 130, and one or more outputs 140. A protection circuit 200 is illustrated as having one or more inputs 210 and one or more outputs 220. The input 210 of the protection circuit 200 is coupled to the output of the circuit 100. The output 220 of the protection circuit 200 is coupled to the second input 120 of the circuit 100. Although illustrated as two circuits 100, 200, the circuit 100 and the protection circuit 200 can be part of the same circuit (e.g., integrated circuit, integrated circuit chip, application-specific integrated circuit (ASIC), circuit block, etc.)

In operation, when the circuit 100 is operating normally, the protection circuit 200 does not substantially interfere with the output signal at the output 120 and/or does not consume a lot of power. Input signals are input at the first input 110 and processed (e.g., filtered, modified, amplified, modulated, demodulated, multiplexed, demultiplexed, conditioned, sensed, packaged, packetized, etc.) by the circuit 100. The circuit 100 then provides output signals based on the input signals on the output 140 of the output stage 130 and/or the circuit 100.

When the circuit 100 is operating in a short circuit condition such that a large amount of current is passing out of or into the output 140, the protection circuit 200 senses the large amount of current via its input 210 and reduces the amount of current passing into or out of the output 140 by providing a feedback response to the second input 120 of the circuit 100. In an example embodiment, the protection circuit 200 provides a feedback response to the second input 120 of the circuit 100 that controls, at least in part, a voltage and/or a current of the output 140 to reduce the amount of current passing into or out of the output 140. In an example embodiment, the protection circuit 200 sends a voltage and/or a current to the second input 120 of the circuit 100 that causes a reduction in the amount of current passing into or out of the output 140. Thus, the circuit 100 is protected from damage that can be caused by sinking or sourcing a large amount of current, for example, during a short circuit event at the output 140.

Figure 2:
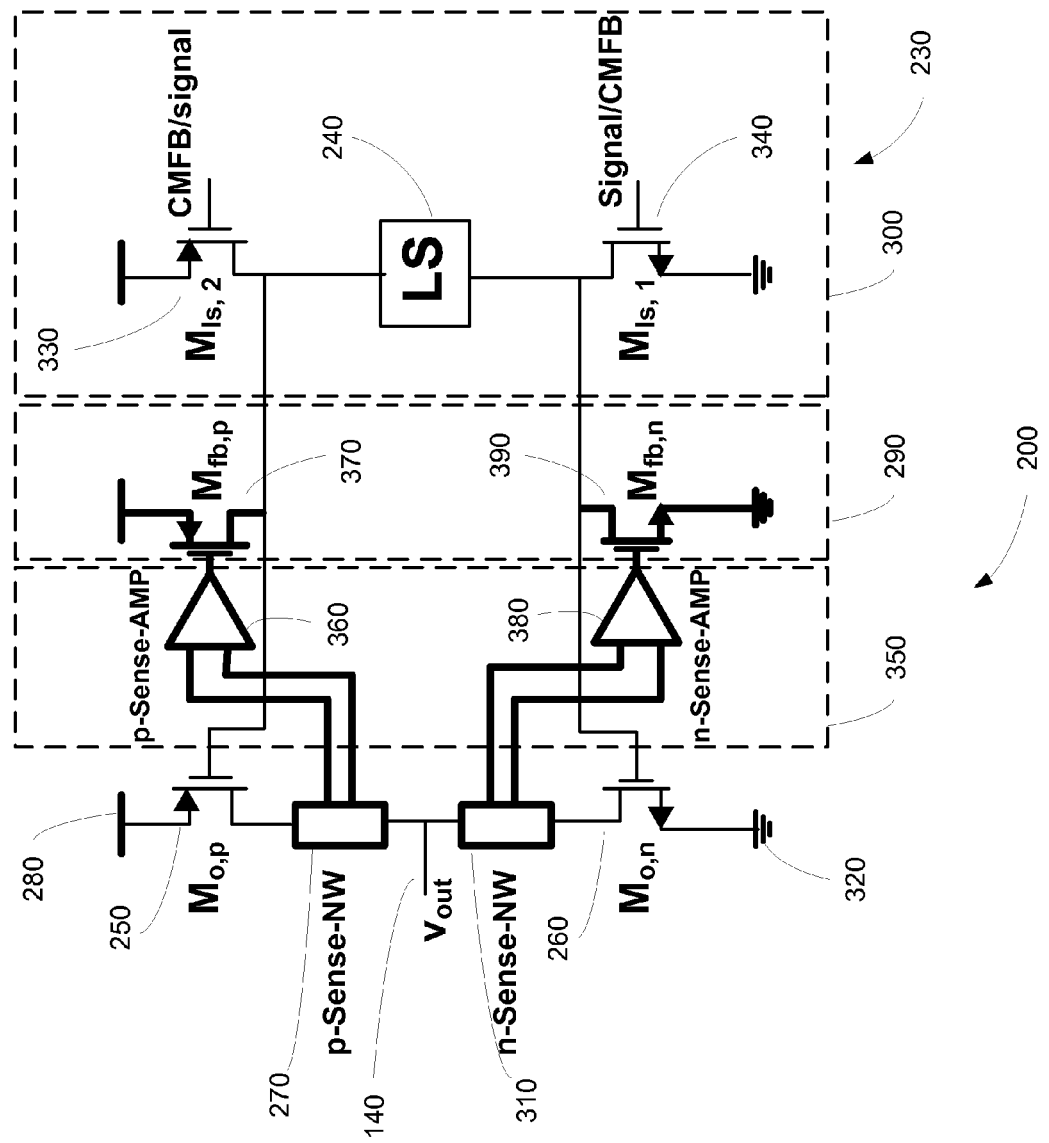
FIG. 2 is a circuit diagram of an example embodiment of a short-circuit protection circuit.

Referring to FIG. 2, an example embodiment of the protection circuit 200 is illustrated. In FIG. 2, the circuit 100 to be protected includes, for example, an amplifier 230 (e.g., a power amplifier) that includes a level shifter circuit 300, transistors 250, 260, and the output 140 (e.g., output $V_{out}$). The output stage 130 of the circuit 100 can include or can be, for example, the output stage of the amplifier 230 (e.g., a power amplifier). The level shifter circuit 300 includes, for example, transistors 330, 340 and a level shifter 240 (e.g., a level shifter for a Class AB power amplifier).

The transistor 250 of the amplifier 230 is illustrated as a PMOS transistor and the transistor 260 of the amplifier 230 is illustrated as an NMOS transistor; however, the transistors 250, 260 (as well as any of the illustrated transistors herein) can be a different type of transistor such as a different type of MOS transistor, BJT, FET, etc. In an example embodiment, the protection circuit 200 and/or the circuit 100 employs CMOS transistors.

The transistor 250 is coupled to a sense network 270 via its drain. The source of the transistor 250 is coupled to a power supply 280 (e.g., a power supply $V_{DD}$). The gate of the transistor 250 is coupled to a feedback network 290 and a level shifter circuit 300.

The transistor 260 is coupled to a sense network 310 via a drain. The source of the transistor 260 is coupled to an electrical ground 320 or a power supply (e.g., a power supply $V_{SS}$). The gate of the transistor 260 is coupled to the feedback network 290 and the level shifter circuit 300.

The $V_{out}$ output 140 is coupled to the transistor 250 via the sense network 270 and is coupled to the transistor 260 via the sense network 310. In an example embodiment, the $V_{out}$ output 140 is an output of the output stage 130 of the amplifier 230 (e.g., a power amplifier) and/or the circuit 130. In an example embodiment, the amplifier 230 and the protection circuit 200 can be split up into high side and low side circuits in which the $V_{out}$ output 140 and portions of the level shifter circuit 300 (e.g., the level shifter 240) are part of both the high side and low side circuits.

The sense network 270 can be configured, for example, to sense a current passing through the transistor 250 and/or the $V_{out}$ output 140, or a voltage indicative of the current passing through the transistor 250 and/or the $V_{out}$ output 140. The sense network 260 can be configured, for example, to sense a current passing through the transistor 260 and/or the $V_{out}$ output 140, or a voltage indicative of the current passing through the transistor 260 and/or the $V_{out}$ output 140.

The sense network 270 is coupled to a sense amplifier circuit 350 which, in turn, is coupled to the feedback network 290. In an example embodiment, the sense network 270 provides two input signals to a sense amplifier 360 of the sense amplifier circuit 350. The sense amplifier circuit 360 of the sense amplifier circuit 350 provides an input signal for a transistor 370 of the feedback network 290. The transistor 370 is a PMOS transistor with a gate coupled to an output of the sense amplifier 360, a source coupled to the power supply 280, and a drain coupled to the gate of the transistor 250 and the level shifter circuit 300.

The sense network 310 is coupled to the sense amplifier circuit 350 which, in turn, is coupled to the feedback network 290. In an example embodiment, the sense network 310 provides two input signals to a sense amplifier 380 of the sense amplifier circuit 350. The sense amplifier circuit 380 of the sense amplifier circuit 350 provides an input signal for a transistor 390 of the feedback network 290. The transistor 390 is an NMOS transistor with a gate coupled to an output of the sense amplifier 380, a source coupled to the electrical ground 320 or, for example, another power supply $V_{SS}$, and a drain coupled to the gate of the transistor 260 and the level shifter circuit 300.

The level shifter circuit 300 includes, for example, the transistors 330, 340 and the level shifter 240.

In an example embodiment, the transistor 330 is a PMOS transistor. The gate of the transistor 330 receives a common mode feedback signal and/or an input signal to the level shifter circuit 300. The source of the transistor 330 is coupled to the power supply 280. The drain of the transistor 330 is coupled to the level shifter 240, the drain of the transistor 370 of the feedback network 290, and the gate of the transistor 250 of the amplifier 230 (e.g., a power amplifier) and/or the circuit 100.

In an example embodiment, the transistor 340 is an NMOS transistor. The gate of the transistor 340 receives an input signal to the level shifter circuit 300 and/or the common mode feedback signal. The source of the transistor 340 is coupled to the electrical ground 320 or, for example, another power supply $V_{SS}$. The drain of the transistor 340 is coupled to the level shifter 240, the drain of the transistor 390 of the feedback network 290, and the gate of the transistor 260 of the amplifier 230 (e.g., a power amplifier) and/or the circuit 100.

In operation, the sense network 270 senses a current that is passing through the transistor 250 and/or the $V_{out}$ output 140. The sense network 270 can sense the current passing through the transistor 250 and/or through the $V_{out}$ output 140, or can sense a voltage that is indicative of the current passing through the transistor 250 and/or through the $V_{out}$ output 140. In an example embodiment, the sense network 270 senses a voltage and sends the voltage as a two-input signal to the sense amplifier 360 of the sense amplifier circuit 350.

During normal operation in which a short circuit condition is not present at the $V_{out}$ output 140 of the circuit 100, the sense network 270 provides a voltage to the sense amplifier 360. In an example embodiment, this sense voltage is indicative of the current in the output stage 130. Since the amount of sensed current is small compared with a short circuit condition, the sense amplifier 360 does not provide an output signal that turns on the transistor 370. Thus, transistor 370 of the feedback network 290 does not affect the normal operation of the level shifter circuit 300 to which the transistor 370 is coupled. In addition, the protection circuit 200 consumes a small amount of power during normal operation. In an example embodiment, the power consumption of the protection circuit 200 is mainly from small current sources in the sense amplifier 360.

In a short circuit condition of the circuit 100, a large amount of current is provided into or out of the $V_{out}$ output 140. In an example embodiment, a short circuit condition of the circuit 100 occurs when the $V_{out}$ output 140 is, for example, coupled via low impedance to a power supply (e.g., a power supply $V_{DD}$, $V_{SS}$) or to an electrical ground. In another example embodiment, a short circuit condition of the circuit 100 occurs when the current through the $V_{out}$ output 140 exceeds a threshold amount.

Without the protection circuit 200, the large amount of current passing into or out of the $V_{out}$ output 140 can cause damage to the circuit 100. In an example embodiment, the transistors 250, 260, for example, can be damaged by the large amount of current associated with the short circuit condition.

In an example embodiment, the sense network 270 senses a voltage that is indicative of the large amount of current that is passing through the transistor 250 and/or through the $V_{out}$ output 140 during a short circuit condition. The voltage is amplified by the sense amplifier 360. The amplified voltage during a short circuit condition is sufficient to turn on the transistor 370. When the transistor 370 is turned on, the transistor 370 sources current into the level shifter 240 which, in turn, raises the voltage of the node that includes, for example, the drain of the transistor 330, the drain of transistor 370 and the gate of the transistor 250. By raising the voltage of the gate of the transistor 250, current passing through the transistor 250 is reduced (e.g., throttled), thereby reducing the large current caused by the short circuit condition. In an example embodiment, raising the voltage of the gate of the transistor 250 reduces the voltage at the $V_{out}$ output 140.

In an example embodiment, a similar explanation can be made with respect to sense network 310, the sense amplifier 380, the transistor 390, the level shifter 240 and the transistor 260. Some of the noted differences in the similar explanation relate to, for example, the polarities of devices (e.g., transistors), currents and/or voltages. Thus, for example, when the transistor 390 is turned on, the transistor 390 sinks current out of the level shifter 240 which, in turn, reduces the gate voltage at the transistor 260. The reduced gate voltage at the transistor 260 effectively reduces (e.g., throttles) the current passing through the transistor 260 and the $V_{out}$ output 140.

Figure 3:
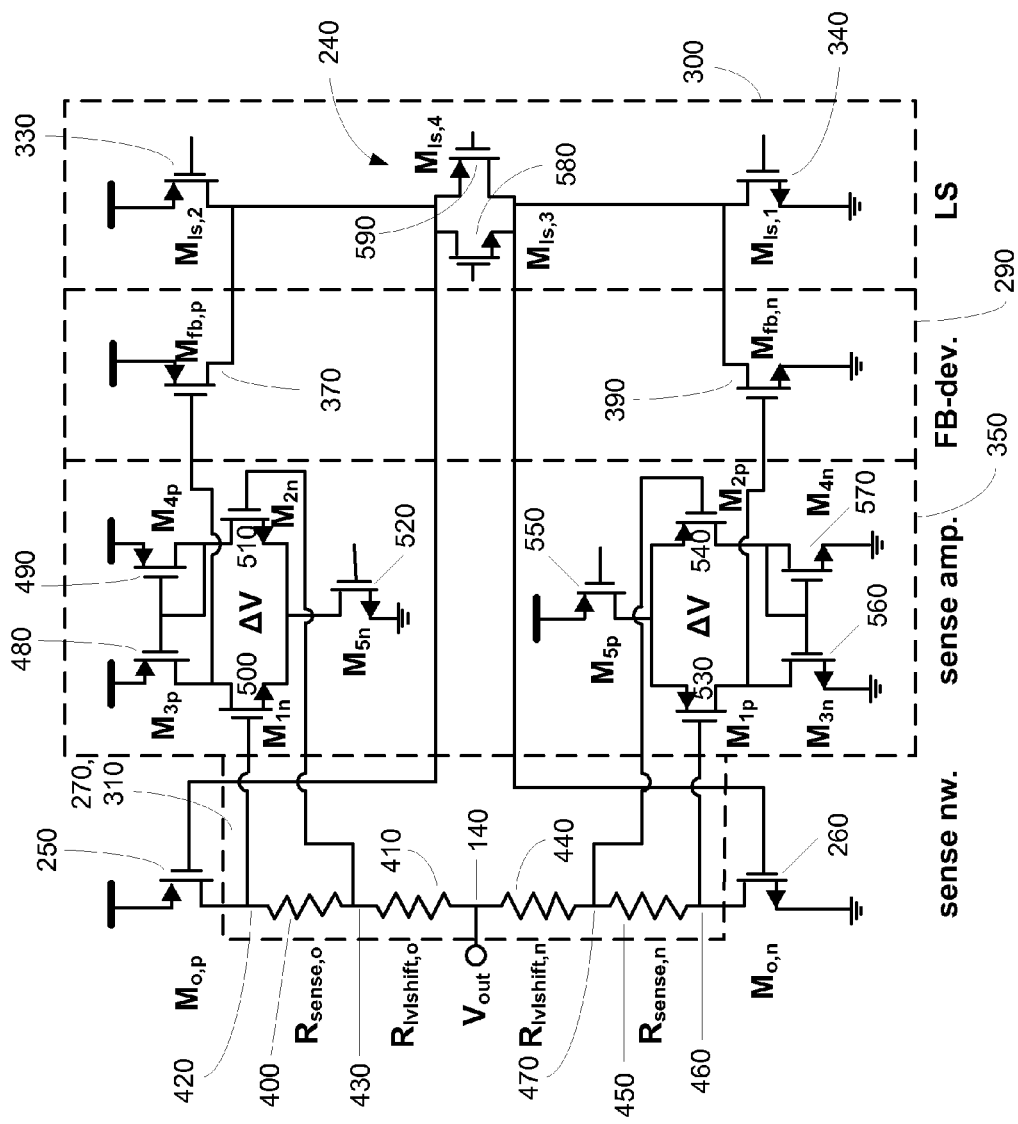
FIG. 3 is a circuit diagram of an example embodiment of a short-circuit protection circuit.

FIG. 3 shows an example embodiment of the protection circuit 200 with some greater circuital detail.

Referring to FIG. 3, the sense network 270 is illustrated as two resistors 400, 410 in a series configuration. The sense network 270 is configured to sense a voltage across two nodes of the resistors 400. In an example embodiment, the sense network 270 senses node 420 and node 430. The node 420 includes, for example, a terminal of the resistor 400, the drain of the transistor 250, a first input to the sense amplifier 360. The node 430 includes, for example, a terminal of the resistor 400, a terminal of the resistor 410 and a second input to the sense amplifier 360. The resistor 410 is configured to ensure that the inputs to the sense amplifier 360 do not exceed a particular input voltage range. Maintaining the particular input voltage range using the resistor 410 can improve a response time of the protection circuit 200. In addition to a short circuit mode (e.g., a short circuit condition) maintaining the particular input voltage range using the resistor 410 can be useful for a mission mode (e.g., a normal operating condition) in which an output can exhibit high swings according to an example embodiment.

The sense network 310 senses a voltage across two nodes of the two resistors 440, 450. In an example embodiment, the sense network 310 senses node 460 and node 450. The node 460 includes, for example, a terminal of the resistor 440, a terminal of the resistor 450 and a first input to the sense amplifier 380. The node 460 includes, for example, a terminal of the resistor 450, a drain of the transistor 260 and a second input to the sense amplifier 380.

The sense amplifier 360 includes, for example, transistors 480, 490, 500, 510, 520. The transistors 480, 490 are PMOS transistors with coupled gates. The transistor 490 is configured as a diode. The transistors 500, 510, 520 are NMOS transistors. The transistor 520 is configured to act as a current source. The transistors 500, 510 are configured as a differential amplifier with a common source that is coupled to the transistor 520, which is configured to act as the current source. The gates of the transistors 500, 510 provide the inputs of the sense amplifier 360. The drains of the transistors 500, 510 are coupled to the drains of the transistors 480, 490, respectively. The transistors 500, 510 are further configured as a differential amplifier with a voltage offset $\Delta V$. The inputs are provided by the sense network 270 by taking a voltage across the resistor 400. The output of the sense amplifier 360 is provided by the drain of the transistor 500. The output of the sense amplifier 360 is provided as an input to the feedback network 290.

The sense amplifier 380 includes, for example, transistors 530, 540, 550, 560, 570. The transistors 560, 570 are NMOS transistors with coupled gates. The transistor 570 is configured as a diode. The transistors 530, 540, 550 are PMOS transistors. The transistor 550 is configured to act as a current source. The transistors 530, 540 are configured as a differential amplifier with a common source that is coupled to the transistor 550, which is configured to act as the current source. The gates of the transistors 530, 540 provide the inputs of the sense amplifier 380. The drains of the transistors 560, 570 are coupled to the drains of the transistors 530, 540, respectively. The transistors 530, 540 are further configured as a differential amplifier with a voltage offset $\Delta V$. The inputs are provided by the sense network 310 by taking a voltage across the resistor 450. The output of the sense amplifier 380 is provided by the drain of the transistor 530. The output of the sense amplifier 380 is provided as an input to the feedback network 290.

The feedback network 290 includes, for example, the transistors 370, 390. The transistor 370 is a PMOS transistor. The gate of the transistor 370 is coupled to the drain of the transistor 500 and provides an input to transistor 370 of the feedback network 290. The drain of transistor 370 is coupled to an input of the level shifter circuit 300 and provides an output of the transistor 370 of the feedback network 290. The transistor 390 is an NMOS transistor. The gate of the transistor 390 is coupled to the drain of the transistor 560 and provides an input to the transistor 390 of the feedback network 290. The drain of transistor 390 is coupled to an input of the level shifter circuit 300 and provides an output of the transistor 390 of the feedback network 290.

The level shifter circuit 300 includes, for example, transistors 330, 340 and the level shifter 240. The level shifter 240 includes, for example, the transistors 580, 590. Transistors 330, 590 are PMOS transistors. Transistors 340, 580 are NMOS transistors. The drain of the transistor 580 is coupled to the source of the transistor 590. The drain of the transistor 480 is also coupled to the drains of the transistors 330, 370 and the gate of the transistor 250. The source of the transistor 580 is coupled to the drain of the transistor 590. The source of the transistor 580 is also coupled to the drains of the transistors 340, 390 and the gate of the transistor 260. In an example embodiment, the gates of transistors 580, 590 are tied to a fixed voltage to allow for level shifting operation.

During normal operation, the circuit 100 provides an output signal on the $V_{out}$ output 140. In an example embodiment, the output signal is provided, at least in part, by the transistor 250 and/or the transistor 260. Based on inputs received by the level shifter circuit 300, the level shifter circuit 300 (e.g., the level shifter 240) can provide an output signal for the circuit 100 that is then amplified and/or buffered by the transistors 250, 260 before being provided on the $V_{out}$ output 140. When current passes through the transistor 250, the current also passes through the resistors 400, 410 of the sense network 270. A voltage is sensed across the resistor 400 and input to the sense amplifier 360.

The sense amplifier 360 is characterized by a voltage offset $\Delta V$. In an example embodiment, the voltage offset $\Delta V$ can be provided by sizing transistors 500, 510 differently, for example. The voltage offset $\Delta V$ causes the current generated by the transistor 520, which is configured as a current source, to flow through the transistors 510, 490 instead of the transistors 500, 480 during normal operation in which the voltage sensed across the resistor 400 and input to the gates of the transistors 500, 510 is smaller than the voltage offset $\Delta V$. Since the current of the transistor 520 is not passing through the transistor 500 during normal operation, the transistor 500 does not provide an output that turns on the transistor 370 of the feedback network 290. Thus, the feedback network 290 does not interfere with the level shifter circuit 300 during normal operations. In addition, power consumption by the protection circuit 200 is low during normal operation, since power consumption is substantially limited to the transistor 520 that is acting as a current source during normal operation.

During a short circuit condition, the circuit 100 provides a large current on the $V_{out}$ output 140. In an example embodiment, the large current is the result of a short circuit condition and the common mode feedback's response (applied through the level shifter circuit 300) which allows more current to flow in the output devices (e.g., the transistors 250, 260). The large current is detected by the sense network 270 by sensing a large voltage across the resistor 400. The large voltage is input to the differential amplifier configuration of the transistors 500, 510 of the sense amplifier 360. In the short circuit condition, the large voltage is greater than the voltage offset $\Delta V$. The large voltage causes the current generated by the transistor 520 (e.g., a current source) to flow through the transistors 500, 580 instead of the transistors 510, 490. Since the current flows through the transistor 500, the transistor 500 provides an output signal on its drain to the gate of the transistor 370 of the feedback network 290.

The output signal received at the gate of the transistor 370 turns on the transistor 370. When the transistor 370 is turned on, the transistor 370 sources current into the transistors 580, 590 of the level shifter 240 which, in turn, increases the voltage of the node that includes the drains of the transistors 370, 330 and the gate of the transistor 250. In an example embodiment, the transistor 370, when turned on, sources current into the level shifter circuit 300 (e.g., into the level shifter 240) of the circuit 100 (e.g., a power amplifier) to overcome a common-mode feedback response of the level shifter circuit 300 in the short circuit condition. When the voltage is increased at the gate of the transistor 250, the amount of current passing through the transistor 250 and the $V_{out}$ output 140 is decreased. In an example embodiment, the current continues to decrease until the voltage across the resistor 400 is less than the voltage offset $\Delta V$. The reduction in current passing through the transistor 250 and the $V_{out}$ output 140 alleviates the risk that the current will damage the circuit 100, for example, the transistor 250 of the circuit 100.

In an example embodiment, a similar explanation can be made with respect to the resistors 440, 450, the transistors 550, 530, 540, 560, 570 of the sense amplifier 380, the transistor 390 of the feedback network 290, the transistors 340, 580, 590 of the level shifter circuit 300 and the transistor 260 of the circuit 100 (e.g., a power amplifier). Some of the noted differences in the similar explanation relate to, for example, the polarities of devices (e.g., transistors), currents and/or voltages.

In sum, an example embodiment provides a system or a method for protecting a circuit. The example embodiment can include, for example, a sense network that receives an output signal from the power amplifier that is to be protected. The sense network can include, for example, a first resistor and a second resistor in series. The sense amplifier has a first input and a second input in which the first input is coupled to a first end of the first resistor and in which second input is coupled to a second end of the first resistor. The sense amplifier amplifies a voltage across the first resistor of the sense network in which the voltage is based on the output signal from the power amplifier. Based on the amplified voltage of the sense amplifier, the feedback network reduces a current of the output signal from the power amplifier to protect the power amplifier from damage due to a short circuit condition.

In an example embodiment, during a short circuit condition at an output of a particular transistor, which provides an output of a circuit, a feedback transistor sources or sinks a current into or out of a level shifter which, in turn, pulls up or pulls down an input voltage to the particular transistor of the circuit to reduce the current provided to or from the output of the circuit to protect the circuit (e.g., the particular transistor) from harmful currents.

In an example embodiment, when a feedback transistor is turned on during a short circuit condition at the output of a particular transistor, which provides an output of a circuit, the feedback transistor provides enough current to cancel the common mode feedback response of a level shifter to the short-circuit condition.

In an example embodiment, during a short circuit condition at an output of a particular transistor, which provides an output of a power amplifier, a feedback transistor provides a feedback response that is strong enough to cancel or dominate a common mode feedback response of a power amplifier that has an output that is shorted to one of the power supplies, an electrical ground, or is otherwise in a short-circuit condition.

An example embodiment provides a protection circuit that can be deployed in a variety of high power delivery circuits that interface with transducers, including one or more of the following: radio frequency power amplifiers, high-speed buffers, light emitting diode (LED) drivers, and audio power amplifiers.

An example embodiment provides that the circuit to be protected is part of a line driver (e.g., an integrated asymmetric digital subscriber line driver). The protection circuit can be employed with upstream and/or downstream line drivers. In an example embodiment, the line driver is configured to transmit high-power 25 kHz-2.2 MHz discrete multi-tone signals into a transformer-coupled 100Ω line. Line drivers can deliver high current into low impedance loads at signal peaks. An example embodiment provides that the protection circuit 200 prevents damage to the line driver during short-circuit events (e.g., on the chip or line side of the transformer) such as during assembly and/or field operation. The protection circuit can be configured to prevent electro-migration failures and thermal runaway, while not interfering with mission-mode operation of the line driver.

An example embodiment provides that the protection circuit provides on-chip protection circuitry.

An example embodiment provides that the protection circuit protects integrated power amplifiers that drive signals off chip. Integrated power amplifiers can be sensitive to overloading such as when the output exhibits a short circuit or is coupled to a low impedance path to a supply or an electrical ground.

An example embodiment provides that the protection circuit that protects a power amplifier is coupled, at least in part, to the common mode feedback loop. In an example embodiment, the common mode feedback loop establishes an output common mode level.

An example embodiment provides that the protection circuit provides a feedback network that is configured to sink and to source current to a power amplifier level shifter when the feedback network is turned on in response to a short circuit condition. The sinking and sourcing of current effectively overrides the common mode feedback of the power amplifier level shifter, thereby reducing current at the power amplifier output.

An example embodiment provides that the protection circuit employs a comparator that includes a differential amplifier with a voltage offset.

An example embodiment provides that the protection circuit employs CMOS technology.

An example embodiment provides that the protection circuit provides short circuit protection to circuits that deliver high power to low impedances.

An example embodiment provides that the protection circuit include a sense amplifier that is a differential-to-single ended amplifier whose input devices are offset. The offset provides for an additional degree of freedom in sizing a sense resistor used in sensing a voltage in a sense network and provides for improved control of the output voltage of the sense amplifier. The sense amplifier offset and the sense resistor can determine a particular trip point current at which the protection circuit begins to manipulate a level shifter of a power amplifier to reduce the overall current in the output of the power amplifier.

An example embodiment provides a protection circuit that includes a feedback network that is configured to sink and to source current in parallel to a level shifter which can be part of a common mode feedback loop.

An example embodiment provides a protection circuit that includes a feedback network that shares access to an input node of an output transistor of a power amplifier that needs protection from short circuit conditions with a common mode feedback signal applied through a level shifter circuit of the power amplifier.

An example embodiment provides for protecting a line driver (e.g., a CMOS Class AB line driver) against overcurrent damage when the output (e.g., a $V_{out}$ output) is shorted to one of the power supplies $V_{DD}$, $V_{SS}$, or to an electrical ground.

An example embodiment provides that, with single-ended or pseudo-differential loads, the output node becomes low impedance enough that a comparator can be an operational transconductance amplifier (OTA) with high output impedance and the transistor inserted in the circuit to be protected can be a switch.

An example embodiment provides that resistor loads, instead of diode loads, can be used in the sense amplifier. Resistors might be appropriate for particular low-supply operations where a 1/R reference current is available.

While the present method and apparatus has been described with reference to certain embodiments, it will be understood by those skilled in the art that various changes may be made and equivalents may be substituted without departing from the scope of the present method and apparatus. In addition, many modifications may be made to adapt a particular situation or material to the teachings of the present disclosure without departing from its scope. Therefore, it is intended that the present method and apparatus not be limited to the particular embodiment disclosed, but that the present method and apparatus will include all embodiments falling within the scope of the appended claims.

What is claimed is:

1. One or more circuits that provide short circuit protection for a power amplifier, comprising:
    a sense network that receives an output current from the power amplifier that is to be protected, the sense network including a first resistor and a second resistor, the first resistor being in electrical series with the second resistor;
    a sense amplifier that has a first input and a second input, the first input being operatively coupled to a first end of the first resistor, the second input being operatively coupled to a second end of the first resistor, the sense amplifier amplifying a voltage across the first resistor of the sense network, the voltage being amplified by the sense amplifier is based on the output current from the power amplifier; and
    a feedback network that, based on the amplified voltage of the sense amplifier, reduces the output current from the power amplifier to protect the power amplifier from damage due to a short circuit condition;
    wherein the feedback network is configured to sink and to source current into a level shifter of the power amplifier to overcome a common-mode feedback response of the power amplifier in the short circuit condition.

2. The one or more circuits according to claim 1, wherein the second resistor is configured to ensure that the first input and the second input of the sense amplifier are maintained within a particular voltage range.

3. The one or more circuits according to claim 1, wherein the feedback network turns on when the power amplifier is in the short circuit condition.

4. The one or more circuits according to claim 1, wherein the feedback network turns on a first transistor of the feedback network when the power amplifier is in the short circuit condition, wherein the first transistor decreases a voltage of an output voltage signal of a level shifter of the power amplifier, wherein the decreased output voltage of the level shifter reduces the output current from the power amplifier to protect the power amplifier from damage due to the short circuit condition.

5. The one or more circuits according to claim 1, wherein the feedback network turns on a first transistor of the feedback network when the power amplifier is in the short circuit condition, wherein the first transistor increases a voltage of an output voltage signal of a level shifter of the power amplifier, wherein the increased output voltage of the level shifter reduces the output current from the power amplifier to protect the power amplifier from damage due to the short circuit condition.

6. The one or more circuits according to claim 1, wherein the sense amplifier includes transistors in differential amplifier configurations.

7. The one or more circuits according to claim 6, wherein the differential amplifier configurations are unbalanced by a voltage offset.

8. The one or more circuits according to claim 1, wherein the sense amplifier includes a current source and an unbalanced differential amplifier configuration that causes current from the current source to flow through a first transistor of the unbalanced differential amplifier configuration during a normal condition and through a second transistor of the unbalanced differential amplifier configuration during the short circuit condition.

9. The one or more circuits according to claim 1, wherein the sense amplifier includes transistors in a differential amplifier configuration, and wherein the transistors are different sizes such that the differential amplifier configuration has a voltage offset, wherein the voltage offset is a threshold indicator of the short circuit condition.

10. The one or more circuits according to claim 1, wherein the sense amplifier includes first transistors in a differential amplifier configuration, and wherein the differential amplifier configuration has two inputs and a single output.

11. The one or more circuits according to claim 10, wherein the single output is configured to turn on a second transistor in the feedback network when the power amplifier is in the short circuit condition.

12. The one or more circuits according to claim 1, wherein the sense amplifier includes at least two transistors in a differential amplifier configuration, a diode, and a current source, and wherein the differential amplifier is characterized by a voltage offset that has to be overcome before current generated by the current source passes from one branch of the differential amplifier to another branch of the differential amplifier.

13. The one or more circuits according to claim 1, wherein the output current from the power amplifier is a single-ended output current, wherein the sense network includes circuitry that receives two input signals indicative of the single-ended output current of the power amplifier, and wherein the two input signals are input into a differential amplifier characterized by a voltage offset.

14. The one or more circuits according to claim 13, wherein the circuitry of the sense network sends the two input signals as differential inputs to the differential amplifier, and wherein the differential amplifier provides a single output signal to the feedback network.

15. A method for providing short circuit protection to a power amplifier, comprising:
receiving a first voltage across a resistor of a plurality of resistors in electrical series, wherein the resistor is in an output path that includes an output transistor of an output stage of the power amplifier and an output of the power amplifier;
switching a current from a first branch of a differential amplifier to a second branch of the differential amplifier when the received voltage exceeds a voltage offset of the differential amplifier, wherein the second branch of the differential amplifier includes a first transistor;
turning on a feedback transistor via an output of the first transistor after the switching of the current; and
decreasing a second voltage at an input of the output transistor to decrease an amount of current passing through the output transistor and the output of the power amplifier;
wherein, when the received voltage exceeds the voltage offset of the differential amplifier, the output of the power amplifier is in a short circuit condition.

16. The method according to claim 15, wherein the decreased second voltage at the input of the output transistor is caused by the feedback transistor sinking current out of a level shifter, and wherein the level shifter and the feedback transistor share an electrical node with the input of the output transistor.

17. A system for providing short circuit protection to a power amplifier, comprising:

a plurality of resistors disposed between an output transistor of an output stage of the power amplifier and an output of the power amplifier, wherein the plurality of resistors are configured in electrical series;
a differential amplifier operatively coupled to a first terminal of a resistor of the plurality of resistors and to a second terminal of the resistor, wherein the differential amplifier receives a first input signal from the first terminal and a second input signal from the second terminal as differential inputs, wherein the differential amplifier is configured with a voltage offset, and wherein the differential amplifier switches a current from a first transistor of a differential amplifier to a second transistor of the differential amplifier when the differential inputs to the differential amplifier provide a differential voltage that exceeds the voltage offset of the differential amplifier;
a feedback transistor operatively coupled to the second transistor, wherein the feedback transistor is turned on by the second transistor when the differential voltage exceeds the voltage offset of the differential amplifier, and wherein the turning on of the feedback transistor causes the output transistor of the output stage to reduce current passing through the output of the power amplifier; and
a level shifter operatively coupled to the output transistor of the output stage of the power amplifier and to the feedback transistor, and wherein the turning on of the feedback transistor causes the feedback transistor to source current into an electrical node that includes an output of the feedback transistor, an output of the level shifter and an input of the output transistor.

18. One or more circuits that provide short circuit protection for a power amplifier, comprising:
a sense network that receives an output current from the power amplifier that is to be protected, the sense network including a first resistor and a second resistor, the first resistor being in electrical series with the second resistor;
a sense amplifier that has a first input and a second input, the first input being operatively coupled to a first end of the first resistor, the second input being operatively coupled to a second end of the first resistor, the sense amplifier amplifying a voltage across the first resistor of the sense network, the voltage being amplified by the sense amplifier is based on the output current from the power amplifier; and
a feedback network that, based on the amplified voltage of the sense amplifier, reduces the output current from the power amplifier to protect the power amplifier from damage due to a short circuit condition;
wherein the sense amplifier includes a current source and an unbalanced differential amplifier configuration that causes current from the current source to flow through a first transistor of the unbalanced differential amplifier configuration during a normal condition and through a second transistor of the unbalanced differential amplifier configuration during the short circuit condition.

19. The one or more circuits according to claim 18, wherein the feedback network is configured to sink and to source current into a level shifter of the power amplifier to overcome a common-mode feedback response of the power amplifier in the short circuit condition.

20. The one or more circuits according to claim 18, wherein the second resistor is configured to ensure that the first input and the second input of the sense amplifier are maintained within a particular voltage range.

21. The one or more circuits according to claim 18, wherein the feedback network turns on when the power amplifier is in the short circuit condition, wherein the feedback network works against a common mode feedback response by sinking or sourcing current into a level shifter which is part of a common mode feedback loop for the power amplifier.

22. The one or more circuits according to claim 18, wherein the feedback network turns on a first transistor of the feedback network when the power amplifier is in the short circuit condition, wherein the first transistor decreases a voltage of an output voltage signal of a level shifter of the power amplifier, wherein the decreased output voltage of the level shifter reduces the output current from the power amplifier to protect the power amplifier from damage due to the short circuit condition.

23. The one or more circuits according to claim 18, wherein the feedback network turns on a first transistor of the feedback network when the power amplifier is in the short circuit condition, wherein the first transistor increases a voltage of an output voltage signal of a level shifter of the power amplifier, wherein the increased output voltage of the level shifter reduces the output current from the power amplifier to protect the power amplifier from damage due to the short circuit condition.

24. The one or more circuits according to claim 18, wherein the sense amplifier includes transistors in differential amplifier configurations.

25. The one or more circuits according to claim 24, wherein the differential amplifier configurations are unbalanced by a voltage offset.

26. The one or more circuits according to claim 18, wherein the sense amplifier includes transistors in a differential amplifier configuration, and wherein the transistors are different sizes such that the differential amplifier configuration has a voltage offset, wherein the voltage offset is a threshold indicator of the short circuit condition.

27. The one or more circuits according to claim 18, wherein the sense amplifier includes first transistors in a differential amplifier configuration, and wherein the differential amplifier configuration has two inputs and a single output.

28. The one or more circuits according to claim 27, wherein the single output is configured to turn on a second transistor in the feedback network when the power amplifier is in the short circuit condition.

29. The one or more circuits according to claim 18, wherein the sense amplifier includes at least two transistors in a differential amplifier configuration, a diode, and a current source, and wherein the differential amplifier is characterized by a voltage offset that has to be overcome before current generated by the current source passes from one branch of the differential amplifier to another branch of the differential amplifier.

30. The one or more circuits according to claim 1, wherein the output current from the power amplifier is a single-ended output current, wherein the sense network includes circuitry that receives two input signals indicative of the single-ended output current of the power amplifier, and wherein the two input signals are input into a differential amplifier characterized by a voltage offset.

31. The one or more circuits according to claim 30, wherein the circuitry of the sense network sends the two input signals as differential inputs to the differential amplifier, and wherein the differential amplifier provides a single output signal to the feedback network.

32. One or more circuits that provide short circuit protection for a power amplifier, comprising:

a sense network that receives an output current from the power amplifier that is to be protected, the sense network including a first resistor and a second resistor, the first resistor being in electrical series with the second resistor;

a sense amplifier that has a first input and a second input, the first input being operatively coupled to a first end of the first resistor, the second input being operatively coupled to a second end of the first resistor, the sense amplifier amplifying a voltage across the first resistor of the sense network, the voltage being amplified by the sense amplifier is based on the output current from the power amplifier; and a feedback network that, based on the amplified voltage of the sense amplifier, reduces the output current from the power amplifier to protect the power amplifier from damage due to a short circuit condition;

wherein the sense amplifier includes transistors in a differential amplifier configuration, and wherein the transistors are different sizes such that the differential amplifier configuration has a voltage offset, wherein the voltage offset is a threshold indicator of the short circuit condition.

33. The one or more circuits according to claim 32, wherein the second resistor is configured to ensure that the first input and the second input of the sense amplifier are maintained within a particular voltage range.

34. The one or more circuits according to claim 32, wherein the feedback network turns on when the power amplifier is in the short circuit condition, wherein the feedback network works against a common mode feedback response by sinking or sourcing current into a level shifter which is part of a common mode feedback loop for the power amplifier.

35. The one or more circuits according to claim 32, wherein the feedback network turns on a first transistor of the feedback network when the power amplifier is in the short circuit condition, wherein the first transistor decreases a voltage of an output voltage signal of a level shifter of the power amplifier, wherein the decreased output voltage of the level shifter reduces the output current from the power amplifier to protect the power amplifier from damage due to the short circuit condition.

36. The one or more circuits according to claim 32, wherein the feedback network turns on a first transistor of the feedback network when the power amplifier is in the short circuit condition, wherein the first transistor increases a voltage of an output voltage signal of a level shifter of the power amplifier, wherein the increased output voltage of the level shifter reduces the output current from the power amplifier to protect the power amplifier from damage due to the short circuit condition.

37. The one or more circuits according to claim 32, wherein the sense amplifier includes transistors in differential amplifier configurations.

38. The one or more circuits according to claim 37, wherein the differential amplifier configurations are unbalanced by a voltage offset.

39. The one or more circuits according to claim 32, wherein the sense amplifier includes a current source and an unbalanced differential amplifier configuration that causes current from the current source to flow through a first transistor of the unbalanced differential amplifier configuration during a normal condition and through a second transistor of the unbalanced differential amplifier configuration during the short circuit condition.

40. The one or more circuits according to claim 32, wherein the sense amplifier includes transistors in a differential amplifier configuration, and wherein the transistors are different sizes such that the differential amplifier configuration has a voltage offset, wherein the voltage offset is a threshold indicator of the short circuit condition.

41. The one or more circuits according to claim 32, wherein the sense amplifier includes first transistors in a differential amplifier configuration, and wherein the differential amplifier configuration has two inputs and a single output.

42. The one or more circuits according to claim 41, wherein the single output is configured to turn on a second transistor in the feedback network when the power amplifier is in the short circuit condition.

43. The one or more circuits according to claim 41, wherein the sense amplifier includes at least two transistors in a differential amplifier configuration, a diode, and a current source, and wherein the differential amplifier is characterized by a voltage offset that has to be overcome before current generated by the current source passes from one branch of the differential amplifier to another branch of the differential amplifier.

44. The one or more circuits according to claim 41, wherein the output current from the power amplifier is a single-ended output current, wherein the sense network includes circuitry that receives two input signals indicative of the single-ended output current of the power amplifier, and wherein the two input signals are input into a differential amplifier characterized by a voltage offset.

45. The one or more circuits according to claim 44, wherein the circuitry of the sense network sends the two input signals as differential inputs to the differential amplifier, and wherein the differential amplifier provides a single output signal to the feedback network.

46. One or more circuits that provide short circuit protection for a power amplifier, comprising:
  a sense network that receives an output current from the power amplifier that is to be protected, the sense network including a first resistor and a second resistor, the first resistor being in electrical series with the second resistor;
  a sense amplifier that has a first input and a second input, the first input being operatively coupled to a first end of the first resistor, the second input being operatively coupled to a second end of the first resistor, the sense amplifier amplifying a voltage across the first resistor of the sense network, the voltage being amplified by the sense amplifier is based on the output current from the power amplifier; and
  a feedback network that, based on the amplified voltage of the sense amplifier, reduces the output current from the power amplifier to protect the power amplifier from damage due to a short circuit condition;
  wherein the sense amplifier includes first transistors in a differential amplifier configuration, and wherein the differential amplifier configuration has two inputs and a single output configured to turn on a second transistor in the feedback network when the power amplifier is in the short circuit condition.

47. The one or more circuits according to claim 46, wherein the second resistor is configured to ensure that the first input and the second input of the sense amplifier are maintained within a particular voltage range.

48. The one or more circuits according to claim 46, wherein the feedback network turns on when the power amplifier is in the short circuit condition, wherein the feedback network works against a common mode feedback response by sinking or sourcing current into a level shifter which is part of a common mode feedback loop for the power amplifier.

49. The one or more circuits according to claim 46, wherein the feedback network turns on a first transistor of the feedback network when the power amplifier is in the short circuit condition, wherein the first transistor decreases a voltage of an output voltage signal of a level shifter of the power amplifier, wherein the decreased output voltage of the level shifter reduces the output current from the power amplifier to protect the power amplifier from damage due to the short circuit condition.

50. The one or more circuits according to claim 46, wherein the feedback network turns on a first transistor of the feedback network when the power amplifier is in the short circuit condition, wherein the first transistor increases a voltage of an output voltage signal of a level shifter of the power amplifier, wherein the increased output voltage of the level shifter reduces the output current from the power amplifier to protect the power amplifier from damage due to the short circuit condition.

51. The one or more circuits according to claim 46, wherein the sense amplifier includes transistors in differential amplifier configurations.

52. The one or more circuits according to claim 51, wherein the differential amplifier configurations are unbalanced by a voltage offset.

53. The one or more circuits according to claim 46, wherein the sense amplifier includes at least two transistors in a differential amplifier configuration, a diode, and a current source, and wherein the differential amplifier is characterized by a voltage offset that has to be overcome before current generated by the current source passes from one branch of the differential amplifier to another branch of the differential amplifier.

54. The one or more circuits according to claim 46, wherein the output current from the power amplifier is a single-ended output current, wherein the sense network includes circuitry that receives two input signals indicative of the single-ended output current of the power amplifier, and wherein the two input signals are input into a differential amplifier characterized by a voltage offset.

55. The one or more circuits according to claim 54, wherein the circuitry of the sense network sends the two input signals as differential inputs to the differential amplifier, and wherein the differential amplifier provides a single output signal to the feedback network.

56. One or more circuits that provide short circuit protection for a power amplifier, comprising:
  a sense network that receives an output current from the power amplifier that is to be protected, the sense network including a first resistor and a second resistor, the first resistor being in electrical series with the second resistor;
  a sense amplifier that has a first input and a second input, the first input being operatively coupled to a first end of the first resistor, the second input being operatively coupled to a second end of the first resistor, the sense amplifier amplifying a voltage across the first resistor of the sense network, the voltage being amplified by the sense amplifier is based on the output current from the power amplifier; and
  a feedback network that, based on the amplified voltage of the sense amplifier, reduces the output current from the power amplifier to protect the power amplifier from damage due to a short circuit condition;
  wherein the sense amplifier includes at least two transistors in a differential amplifier configuration, a diode, and a current source, and wherein the differential amplifier is characterized by a voltage offset that has to be overcome before current generated by the current source passes from one branch of the differential amplifier to another branch of the differential amplifier.

57. The one or more circuits according to claim 56, wherein the second resistor is configured to ensure that the first input and the second input of the sense amplifier are maintained within a particular voltage range.

58. The one or more circuits according to claim 56, wherein the feedback network turns on a first transistor of the feedback network when the power amplifier is in the short circuit condition, wherein the first transistor decreases a voltage of an output voltage signal of a level shifter of the power amplifier, wherein the decreased output voltage of the level shifter reduces the output current from the power amplifier to protect the power amplifier from damage due to the short circuit condition.

59. The one or more circuits according to claim 57, wherein the feedback network turns on a first transistor of the feedback network when the power amplifier is in the short circuit condition, wherein the first transistor increases a voltage of an output voltage signal of a level shifter of the power amplifier, wherein the increased output voltage of the level shifter reduces the output current from the power amplifier to protect the power amplifier from damage due to the short circuit condition.

60. A method for providing short circuit protection to a power amplifier, comprising:
  receiving a first voltage across a resistor of a plurality of resistors in electrical series, wherein the resistor is in an output path that includes an output transistor of an output stage of the power amplifier and an output of the power amplifier;
  switching a current from a first branch of a differential amplifier to a second branch of the differential amplifier when the received voltage exceeds a voltage offset of the differential amplifier, wherein the second branch of the differential amplifier includes a first transistor;
  turning on a feedback transistor via an output of the first transistor after the switching of the current; and
  decreasing a second voltage at an input of the output transistor to decrease an amount of current passing through the output transistor and the output of the power amplifier,
  wherein the decreased second voltage at the input of the output transistor is caused by the feedback transistor sinking current out of a level shifter, and wherein the level shifter and the feedback transistor share an electrical node with the input of the output transistor.

* * * * *